United States Patent Office 3,794,533
Patented Feb. 26, 1974

3,794,533

METHOD FOR DIFFUSING Zn INTO A III–V COMPOUND SEMICONDUCTOR CRYSTAL THROUGH ALUMINA MASKING

Eiichi Adachi, Tokyo, and Kazutoshi Saito, Hachioji, Japan, assignors to Hitachi, Ltd., Tokyo, Japan Filed May 19, 1972, Ser. No. 255,084
Claims priority, application Japan, May 19, 1971, 46/33,248; June 1, 1971, 46/37,484
Int. Cl. H01l *7/36, 7/44*
U.S. Cl. 148—175 14 Claims

ABSTRACT OF THE DISCLOSURE

An $Al_2O_3$ film is formed on a surface of a substrate of a III–V compound semiconductor, and Zn is diffused through said $Al_2O_3$ film into said semiconductor as an impurity, whereby a higher impurity concentration is obtained than is obtained by diffusing Zn through an $SiO_2$ film under the same conditions. In the diffusion at the same temperature and for the same period of time, the diffusion depth of Zn depends on the thickness of the $Al_2O_3$ film. At a temperature at which the diffusion of Zn occurs through the $Al_2O_3$ film, Zn does not diffuse through an $Si_3N_4$ film. Isolation and p-n junctions may accordingly be simultaneously provided in such way that an n-type layer is grown on a p-type substrate; thin $Al_2O_3$ films are provided where p-type diffusion layers, to form the pn junctions conjointly with the n-type layer, are disposed, without providing the film at portions at which the isolations are disposed; while a diffusion mask of silicon nitride is provided at the latter parts, and Zn diffusion is carried out.

BACKGROUND OF THE INVENTION

The present invention relates to a method for diffusing Zn as an impurity into a III–V compound semiconductor and, more particularly, to a method for manufacturing a monolithic integrated circuit in which electric insulation is made among a number of p-n junction diodes of a III–V compound semiconductor.

DESCRIPTION OF THE PRIOR ART

When diffusing impurities into III–V compound semiconductors, it is necessary to adopt an impurity diffusing method which may attain good electrical characteristics, while (1) preventing a diffused impurity and an element constituting a semiconductor into which the impurity is diffused from being alloyed (refer, for example, to IEEE Transactions, ED–14 (1967), pp. 705–709), (2) preventing the surface of the semiconductor from being roughened due to deposition of the diffused impurity into the semiconductor surface (refer, for example to 1968 Wescon Technical Papers, Part 3, 10/2 (1968)), and (3) preventing elements composing the compound semiconductor from being disassociated from the semiconductor surface (refer, for example, to U.S. Pats. Nos. 3,139,362 and 3,313,663). Description will be, hereinbelow, directed to methods having heretofore been used for diffusing a group II impurity (such as Zn) or group VI impurity (such as S, Se and Te) into a III–V compound semiconductor for the above purposes. The latter method having been used in case of diffusing a group VI impurity will be referred to in the first place, and the former method having been employed in case of diffusing a II-group impurity will be referred to in the next place.

A method has been suggested wherein for diffusing, into a III–V compound semiconductor, a group VI impurity (such as S, Se and Te) which becomes a donor impurity in the semiconductor, a SiO film is formed on a surface of a substrate of the semiconductor, and the impurity is diffused through the SiO film (see, for example, U.S. Pat. No. 3,313,663). In this case, however, unpreferable compounds such as $Ga_2S_3$, $Ga_2Se_3$ and $Ga_2Te_3$ are prone to be formed at the interface between the SiO film and the compound semiconductor. When they are formed, diffusion is hindered. It has, therefore, been difficult to obtain a good diffusion layer. For this reason, to eliminate this disadvantage there has been devised a method in which an $Al_2O_3$ film is formed on a surface of a substrate of the compound semiconductor, and the impurity is diffused through the $Al_2O_3$ film (see, for example, U.S. Pat. No. 3,139,362). On the other hand, in the case where a group II impurity (such as Zn and Cd), to be used as an acceptor impurity in the III–V compound semiconductor is diffused into the semiconductor, Zn has generally been used since its diffusion coefficient is large. A method has been known in which, after an $SiO_2$ film is formed on the principal plane of a substrate of the compound semiconductor, Zn is diffused through the $SiO_2$ film (refer, for example, to Transactions of the Metallurgical Society of AIME, vol. 230 (1964), pp. 300–306). This method has not caused the difficulty resulting from diffusing the group VI impurity such as S, Se and Te, viz, the difficulty that a compound consisting of Zn and a constituent element of the compound semiconductor is formed to impede the diffusion. However, the surface concentration of Zn at a surface of the semiconductor substrate, which is obtained when diffusing Zn through the $SiO_2$ film into the compound semiconductor, is, for example, approximately $3\times10^{19}$ atoms/cc. in the case where the semiconductor is GaAs. Further, an electrode of low contact resistance is usually formed on the surface of the diffusion layer or to a diffusion layer of low sheet resistance is needed, but realization thereof is extremely difficult with the above diffusion process. A new diffusion process which may attain a still higher surface concentration is, accordingly, necessitated.

The III–V compound semiconductor, with a p-n junction as described above, is utilized in extension fields. As a concrete example of an integrated circuit of the compound semiconductor, there exists a two-dimensional array of light emitting diodes for a small-size picture display. In this case, a system is generally adopted in which a certain row and column are successively selected to choose a diode corresponding to the point of intersection, and the diodes are caused to luminesece to display a desired picture. In order to adopt such a driving system, it is necessary to provide electrical insulation among the respective diodes.

The following two methods have heretofore been employed for the purpose of electrically insulating the respective diodes from one another.

The first is a method which uses an air layer for the electrical insulation and in which, using planar technology and beam lead technology, the group of light emitting diodes spatially separated and arranged in rows and columns are connected by means of row and column wiring (refer to IEEE Trans ED–14, vol. 10 (1967), pp. 705–709).

The second is a method which effects the electrical insulation by the use of silicon oxide glass and which also utilizes semiconductor manufacturing techniques. Interstices among the group of light emitting diodes arranged in rows and columns in a spaced manner are filled with silicon oxide glass, and row and column wirings are provided for the diodes (see 1968 Wescon Technical Papers, 10/2).

With the prior art, however, only a circuit with a degree of integration of approximately 400 to 1,600 diodes/cm.$^2$ is obtained.

Further, prior art monolithic systems have been disadvantageous in that, since each light emitting diode is not separated into a row or column in a region of one conductivity type, it is impossible to make a construction of row and column wirings as is suited to the scanning drive system.

SUMMARY OF THE INVENTION

The present invention has been developed in order to solve the difficulties, as mentioned above, encountered in the case of diffusing Zn into a III–V compound semiconductor and has as its object, the provision of an improved impurity-diffusing method for obtaining a high impurity concentration.

Another object of the present invention is to further enhance the degree of integration of an integrated semiconductor circuit as mentioned above, and to provide a method for manufacturing semiconductor devices which realize the enhancement with the monolithic system.

The inventors have found that, in the case where an $Al_2O_3$ film is formed on a surface of a substrate of a III–V compound semiconductor and where Zn is diffused through the $Al_2O_3$ film, the surface concentration of Zn at the substrate of the compound semiconductor may be easily made several times higher than the above-mentioned value. More specifically, when the compound semiconductor is GaAs, the Zn surface concentration higher than $10^{20}$ atoms/cc. may be realized. Hence, the previously stated difficulty has been solved. The reason that such a high impurity surface concentration of Zn has been obtained is that Zn may exist at a higher impurity concentration in the $Al_2O_3$ film than in an $SiO_2$ film. According to results of experiments by the inventors, it has been revealed that, in comparisons under the same diffusing conditions of Zn, the Zn concentration is in the order of $10^{21}$ atoms/cc. in the $SiO_2$ film while there is a very high impurity concentration in the order of $10^{22}$ atoms/cc. in the $Al_2O_3$ film.

The main reason for which the high impurity concentration of Zn at the surface of the GaAs substrate is attained thus considered to be the higher impurity concentration of Zn within the $Al_2O_3$ film. It is, therefore, a matter of course that with respect to III–V compound semiconductors other than GaAs, a higher impurity concentration may also be realized at the surface of a substrate through the use of the $Al_2O_3$ film than through the use of a $SiO_2$ film for the same reason. The method of the present invention is particularly effective not only for GaAs, but also for compound semiconductors, which are generally represented by the composition formulae: $GaAs_xP_{1-x}$ (where $0.5 \leq x < 1$) and $Ga_{1-x}Al_xAs$ (where $0 < x \leq 0.6$).

In the mixed crystal $GaAs_xP_{1-x}$ when the mixed crystal ratio of GaP is increased, the diffusion coefficient of Zn is decreased. Accordingly, it becomes necessary to lengthen the period of time for performing impurity diffusion, or to raise the diffusion temperature. However, when the temperature is too high, for example, it exceeds approximately 800° C., amorphous $Al_2O_3$ almost becomes $\gamma$-$Al_2O_3$ and the denseness of the latter hinders diffusion. The approximate temperature is, therefore, limited. The diffusion temperature may be, in principal, of any value insofar as it is at or below the above-mentioned temperature. At temperatures below 550° C., however, the diffusion time is excessively long, which is inconvenient in practical use.

Needless to say, the diffusion method of the present invention is feasible not only in the sealed tube process which has hitherto been generally employed in the case of diffusion of compound semiconductors, but it is also applicable to the open tube process, since the surface of the compound semiconductor is covered with an $Al_2O_3$ film, to thereby prevent disassociation of the compound semiconductor at a high temperature.

In order to accomplish the second mentioned object of the present invention, an n-type layer of a III–V compound semiconductor is grown on a p-type substrate of the same material, and thin $Al_2O_3$ films are provided at places where p-type diffusion layers are disposed, to form p-n junctions conjointly with the n-type layer, the film not being provided at the remaining places where isolations are disposed. At the remaining places a diffusion mask such as of silicon nitride is provided which does not allow Zn to pass therethrough and Zn is diffused, whereby the isolations and the p-n junction are simultaneously formed.

The features and advantages of the present invention will become more apparent from the following description of the preferred embodiments.

DESCRIPTION OF THE PREFERRED EMBODIMENTS

Figure 1:
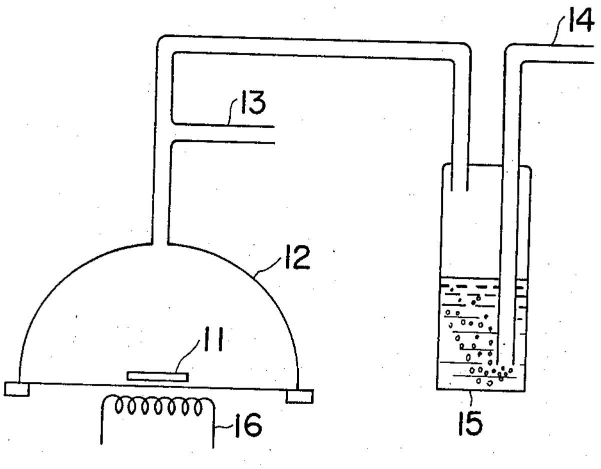
FIG. 1 is a diagram showing an example of an apparatus to be used for performing the method of the present invention.

Description will be made of cases where, using the insulating-film manufacturing apparatus as shown in FIG. 1, semiconductor devices are manufactured in accordance with the present invention.

Referring to FIG. 1, numeral 11 designates an n-type GaAs substrate having a Te concentration of $3 \times 10^{17}$ atoms/cc. Shown at 12, is a bell jar made of quartz glass, in which the substrate 11 is placed. A tube 13 serves to introduce $O_2$ or $N_2$ gas into the bell jar. Numeral 15 indicates a storage tank for an organic aluminum compound such as triisobutyl aluminum and triethoxy aluminum, while numeral 14 represents a tube for introducing $N_2$ gas which serves as a carrier for the aluminum compound. Shown at 16 is a heater for the substrate 11.

Example 1

Figure 2A:
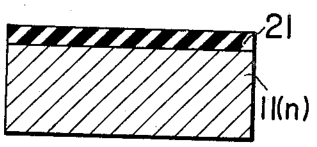
FIGS. 2*a* to 2*c* and FIGS. 3*a* to 3*d* are sectional views showing the manufacturing steps of the present invention.
Figure 2B:
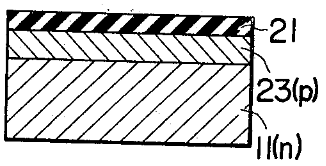
Figure 2C:
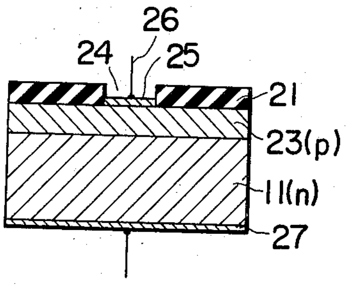

The manufacture of a semiconductor device with the above apparatus will be explained with reference to sectional views shown in FIGS. 2*a* to 2*c*.

While the substrate 11 was heated to about 300° C. by the heater 16, the $N_2$ gas was fed through the gas introducing tube 14 into the aluminum compound storage tank 15 and the $N_2$ gas thus saturated with vapor of the aluminum compound was introduced into the bell jar 12 simultaneously with the $O_2$ gas which was fed through the gas introducing tube 13. Thus, the aluminum compound component and the $O_2$ gas were caused to react to thereby deposit an $Al_2O_3$ film 21 on the GaAs substrate 11 (FIG. 2*a*). In order to obtain a practically required thickness of the film 21, for example, about 1,000 to about 4,000 A., the reaction may be kept at about 300° C. for about 15 minutes to about 1 hour. The substrate 11 with the $Al_2O_3$ film 21 deposited thereon was taken out of the bell jar 12, was vacuum sealed into a quartz tube of an internal volume of about 50 cc. along with about 5 mg. of $ZnAs_2$ and was heated at about 700° C. in a heating furnace for about 4 to 15 hours. Then, Zn permeated through the $Al_2O_3$ film 21 to diffuse into the substrate 11. In the substrate 11 directly under the $Al_2O_3$ film 21, there was formed a diffusion layer 23 which had a conductivity type opposite to that of the substrate 11 and which was approximately 2 to 7$\mu$ deep in the diffusion layer (FIG. 2*b*).

Figure 4:
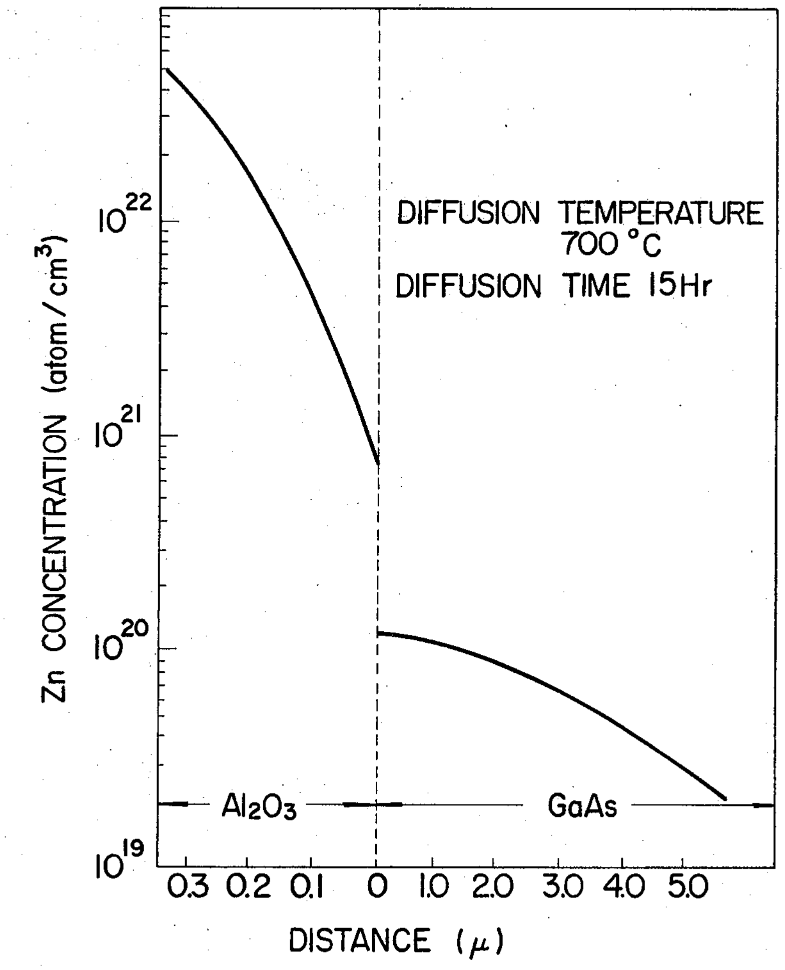
FIG. 4 is a diagram showing the concentration distribution of Zn in the diffusion of Zn into a GaAs substrate through an $Al_2O_3$ film.

The surface concentration of Zn of the layer 23 was approximately $10^{20}$ atoms/cc. An example of the Zn concentration distribution in the $Al_2O_3$ film and the GaAs substrate in this case is shown in FIG. 4. It is apparent from the figure that a remarkably higher impurity concentration is obtained with the $Al_2O_3$ film than with an $SiO_2$ film. Next, a window 24 for forming an electrode was perforated in the $Al_2O_3$ film 21. A metal, such as Au, was evaporated through the window 24 onto the diffusion layer 23, to form the electrode 25. A lead wire 26 of Au was bonded to the electrode. An Au-Ge alloy layer was attached to the bottom of the GaAs substrate 11, and an Au lead wire was bonded thereto to provide an electrode 27. Then, a diode as shown in FIG. 2*c* was obtained.

Example 2

A case where a semiconductor of another type was manufactured using the apparatus shown in FIG. 1, will be explained with reference to sectional views shown in FIGS. 3*a* to 3*d*.

As the substrate 11, an n-type GaAs substrate of a Te concentration of $3\times10^{17}$ atoms/cc., as in the previous example was used.

Figure 3A:
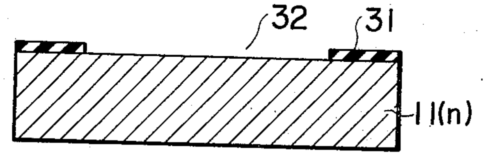
Figure 3B:
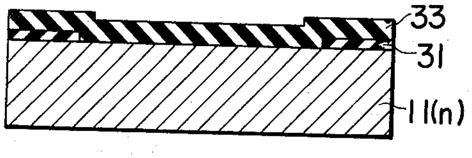

First, a selective diffusion mask 31 was formed on the substrate 11. The mask 31 may be in the form of, e.g., a double-layer film of $Al_2O_3$ and $SiO_2$ as has been already known. The mask 31 consisting of such a double-layer film was obtained such that an $Al_2O_3$ film was first formed by the use of the apparatus in FIG. 1, then a $SiO_2$ film was secondly formed on the $Al_2O_3$ film after the aluminum compound in the apparatus was substituted with a silicon compound such as monosilane or tetraethoxysilane, and finally a window 32 for diffusion was perforated in the double-layer film (FIG. 3*a*).

Figure 3C:
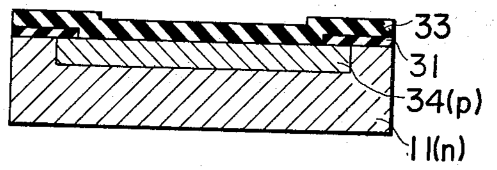
Figure 3D:
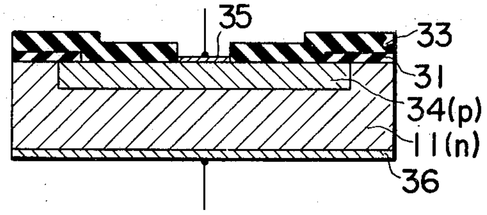

Next, an $Al_2O_3$ film 33 (FIG. 3*b*) was formed on the substrate 11 having the selective diffusion mask 31, by the process as in the previous example. Thereafter, a diffusion layer 34 as well as electrodes 35 and 36 were formed by the processes as in the foregoing example. Then, a diode as illustrated in FIG. 3*d* was obtained (FIGS. 3*c* and 3*d*). The surface concentration of Zn in the diffusion layer 34 in the case was substantially equal to that in Example 1.

Example 3

Another embodiment of a method for manufacturing a semiconductor device according to the present invention will be explained with reference to the sectional views shown in FIGS. 5*a* to 5*e*.

Figure 5A:
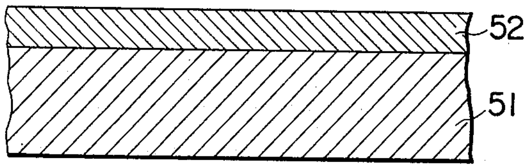
FIGS. 5*a* to 5*e* are sectional views showing the manufacturing steps of a two-dimensional array of diodes according to the method of the present invention.

As a III–V compound semiconductor substrate 51, a semi-insulating GaAs crystal was used. An n-type GaAs layer 52 doped with approximately $10^{17}$ atoms/cc. of S was grown up to a thickness of about 5$\mu$ on a surface of the substrate 51 by epitaxial vapor growth (FIG. 5*a*).

Figure 5B:
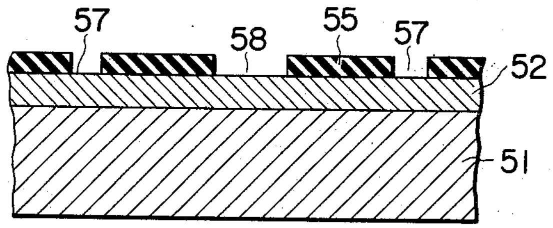

Subsequently, a selective diffusion mask film 55 was formed on the surface of the substrate 51 having undergone the process illustrated in FIG. 5*a*. A double-layer film made of phosphosilicate glass and $Al_2O_3$ or a silicon nitride film, both of which have been known, is used for the mask film 55. Next, using the photoetching technique, a number of apertures 58 separately arranged in rows and columns and having desired dimensions were perforated in the mask film 55, while rectilinear fine grooves 57 were provided between the respectively adjacent rows or columns of the group of apertures 58 arranged in the rows or columns (FIG. 5*b*).

Figure 5C:
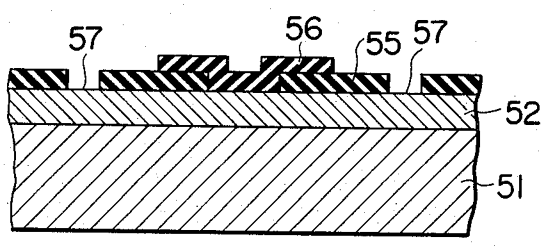

On the second conductivity type layer 52 exposed by the apertures 58 and the mask film 55 around them, an $Al_2O_3$ film 56 having a thickness of, e.g., approximately 1,500 A. was deposited as a film having the effect of suppressing diffusion of a first conductivity type impurity. The formation of the $Al_2O_3$ film 56 was carried out using the so-called chemical vapor deposition in which an aluminum compound such as triisobutyl aluminum is thermally decomposed and oxidized in an oxidizing atmosphere at about 300° C., and is deposited on the substrate 51 in the form of the $Al_2O_3$ (FIG. 5*c*).

Figure 5D:
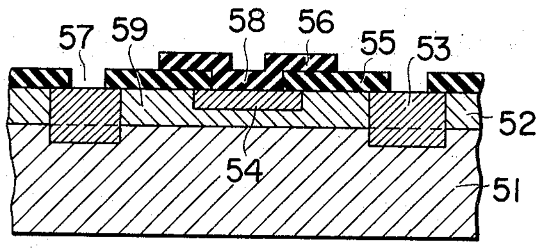
Figure 5E:
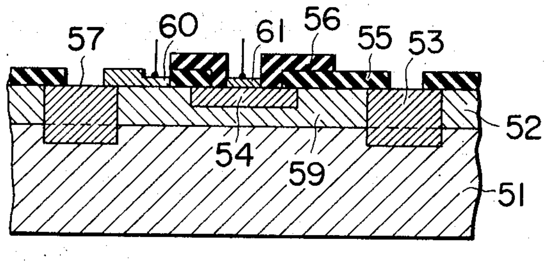

In order to diffuse Zn as the impurity of the first conductivity type into the substrate 51 having undergone the foregoing steps of manufacture, the following measures were taken. The substrate 51 and about 4 mg. of $ZnAs_2$ were sealed at a vacuum of approximately $10^{-6}$ mm. Hg into a quartz ampoule having an internal volume of about 50 cc., and diffusion was carried out as they were held at a temperature of about 750° C. for about 2 hours. Then, shallow diffusion layers 54 being about 2$\mu$ deep were obtained within the second conductivity type layer 52 corresponding to the parts of the apertures 58 having been deposited with the $Al_2O_3$ film 56, while deep diffusion layers 53 penetrating through the layer 52 to reach the substrate 51 and being about 6$\mu$ deep were obtained at the parts of the grooves 57. As a result, p-n junctions were formed between the deep diffusion layers 53 and the layer 52 of the second conductivity type in a manner to be surrounded by the deep diffusion layers 53 of the first conductivity type and the substrate 51 of the semi-insulating property, and the shallow diffusion layers 54 of the first conductivity type being separated and arranged in rows and columns were formed within stripe-shaped layers 59 of the second conductivity type being electrically insulated and isolated by the semi-insulating substrate 51 (FIG. 5*d*).

The isolated and stripe-shaped layers 59 of the second conductivity type thus obtained and the impurity diffused layers 54 of the first conductivity type formed within the layers 59 were respectively provided with metal electrodes 60 and 61. Then, a two-dimensional array of diodes in the row and column arrangement were completed. As a consequence, a semiconductor device having a degree of integration of about $10^4$ diodes/cm.$^2$ was obtained.

While the above description has been made of the case where the semi-insulating compound semiconductor was used for the substrate substantially the same results are obtained with a conductive compound semiconductor.

As apparent from the foregoing detailed description, according to the present invention, a two-dimensional array of light-emitting diodes for a picture display may be easily obtained in a monolithic system.

We claim:

1. A method of diffusing zinc into a III–V compound semiconductor comprising the successive steps of:

(a) depositing an $Al_2O_3$ film on a surface of a substrate of a crystal of said III–V compound semiconductor; and (b) thermally diffusing zinc through said $Al_2O_3$ film deposited thereon.

2. A method of diffusing zinc into a III–V compound semiconductor according to claim 1, further comprising, prior to carrying out successive steps (a) and (b), the successive steps of:

(c) depositing a selective diffusion mask film which completely masks against the diffusion of zinc on the surface of the substrate of said III–V compound semiconductor; and (d) removing, by etching, the selective diffusion mask film at parts corresponding to positions to be selectively diffused in the substrate with said mask film deposited thereon, to thereby form apertures at said parts.

3. A method of diffusing zinc into a III–V compound semiconductor according to claim 1, wherein said III–V compound semiconductor is one selected from the group consisting of GaAs, $GaAs_xP_{1-x}(0.5\leq x<1)$ and $$Ga_{1-x}Al_xAs(0<x\leq0.6)$$

4. A method of diffusing zinc into a III–V compound semiconductor according to claim 1, wherein the temperature at which the thermal diffusion is carried out lies between about 550° C. and about 800° C.

5. A method of diffusing a zinc impurity into a III–V compound semiconductor, comprising the successive steps of:

(a) preparing a substrate of said III–V compound semiconductor;

(b) forming a layer of a III–V compound semiconductor of a first conductivity on a surface of said substrate;

(c) depositing on said layer a mask film which has a diffusion masking action against diffusion of zinc;

(d) providing in said mask film a plurality of apertures and grooves for diffusing said zinc impurity, said apertures being separately arranged in rows and columns, while said grooves are arranged so as to be located between the adjacent rows or columns of said apertures;

(e) covering said apertures in the row and column arrangement with a film of alumina which has the effect of at least partially suppressing the diffusion of said zinc impurity; and (f) diffusing said zinc impurity through said apertures of said mask film which are covered with the diffusion suppressing alumina film and through said grooves of said mask film into said substrate having said layer, so that the diffusion depth of said impurity may not reach said substrate under said apertures, while it may at least reach said substrate under said grooves.

6. A method of diffusing zinc into a III–V compound semiconductor comprising the steps of:

(a) depositing an $Al_2O_3$ film on a surface of a crystal substrate of a III–V compound semiconductor; and (b) thermally diffusing zinc through said $Al_2O_3$ deposited film and into said substrate, by heating said film and said substrate in the presence of a zinc compound to effect the diffusion of zinc into said substrate.

7. A method according to claim 6, wherein said III–V compound semiconductor is one selected from the group consisting of GaAs, $GaAs_xP_{1-x}(0.5<x\leq 1)$, and $$Ga_{1-x}Al_xAs(0<x\leq 0.6)$$

8. A method according to claim 7, wherein the temperature at which said heating takes place lies between about 550° C. and 800° C.

9. A method of diffusion zinc into a III–V compound semiconductor comprising the successive steps of:

(a) forming a selective diffusion mask which completely masks against the diffusion of zinc on a surface of a crystal of the III–V compound semiconductor;

(b) forming a window in said mask to expose a selected portion of said substrate on which said mask has been formed;

(c) depositing an $Al_2O_3$ film on the exposed selected portion of the substrate and on the mask remaining; and (d) thermally diffusing zinc into said substrate through said $Al_2O_3$ deposited film.

10. A method of diffusing zinc into a III–V compound semiconductor comprising the successive steps of:

(a) providing a substrate of III–V compound semiconductor;

(b) forming a layer of a first conductivity type on a surface of said substrate;

(c) forming a diffusion mask film which completely masks against the diffusion of zinc on said layer;

(d) forming first and second windows through said mask to expose first and second selected portions of said layer on which said mask has been formed;

(e) depositing an $Al_2O_3$ film in said first window formed in said mask so as to cover said first window; and (f) thermally diffusing zinc into said layer through said $Al_2O_3$ film to a first depth less than the thickness of said layer, while thermally diffusing zinc into said substrate through said layer through said second window.

11. A method according to claim 10, wherein the temperature at which the thermal diffusion is carried out lies between about 550° C. and about 800° C.

12. A method according to claim 10, wherein said III–V compound semiconductor is one selected from the group consisting of GaAs, $GaAs_xP_{1-x}(0.5\leq x<1)$ and $Ga_{1-x}Al_xAs(0<x\leq 0.6)$.

13. A method according to claim 10, wherein said step (b) comprises epitaxially depositing an *n*-type GaAs layer doped with a sulphur impurity.

14. A method according to claim 10, wherein said diffusing step (f) comprises heating said substrate, layer, and film in the presence of a predetermined amount of $ZnAs_2$.

References Cited

UNITED STATES PATENTS

| | | | |
|---|---|---|---|
| 3,617,929 | 11/1971 | Strack et al. | 317—235 N |
| 3,388,000 | 6/1968 | Waters et al. | 148—187 X |
| 3,313,663 | 4/1967 | Yeh et al. | 148—187 |
| 3,435,306 | 3/1969 | Martin | 317—234 V |
| 3,406,049 | 10/1968 | Marinace | 148—175 |
| 3,629,018 | 12/1971 | Henderson et al. | 148—187 |
| 3,215,570 | 11/1965 | Andrews et al. | 148—187 |

OTHER REFERENCES

Newsome et al.: "Alumina Properties," Technical Paper No. 10, Aluminum Co. of America, Pittsburgh, Pa., 1960, pp. 18 and 19.

GEORGE T. OZAKI, Primary Examiner

U.S. Cl. X.R.

148—186, 187, 189; 252—62.3 GA; 317—235 R